United States Patent
Rim et al.

(10) Patent No.: US 6,633,093 B1
(45) Date of Patent: Oct. 14, 2003

(54) HIGH VOLTAGE PULSE GENERATOR USING A NON-LINEAR CAPACITOR

(75) Inventors: Guen Hie Rim, Seoul (KR); Chu Hyun Cho, Changwon-shi (KR); Ju Won Baek, Changwon-shi (KR); Evgueni P. Pavlov, Changwon-shi (KR)

(73) Assignee: Korea Electrotechnology Research Institute, Changwon (KR)

( * ) Notice: Subject to any disclaimer, the term of this patent is extended or adjusted under 35 U.S.C. 154(b) by 0 days.

(21) Appl. No.: 09/763,258

(22) PCT Filed: Aug. 19, 1999

(86) PCT No.: PCT/KR99/00465
§ 371 (c)(1),
(2), (4) Date: Mar. 26, 2001

(87) PCT Pub. No.: WO00/11784
PCT Pub. Date: Mar. 2, 2000

(30) Foreign Application Priority Data

Aug. 19, 1998 (KR) ......................... 1998-33637

(51) Int. Cl.[7] ................................................ H03K 3/00
(52) U.S. Cl. ...................................... 307/108; 307/106
(58) Field of Search ............................... 307/106, 108; 315/240, 262

(56) References Cited

U.S. PATENT DOCUMENTS

| | | | | |
|---|---|---|---|---|
| 3,953,763 A | * | 4/1976 | Herrick ...................... 315/262 |
| 3,996,495 A | * | 12/1976 | Herman ................... 315/227 R |
| 4,399,376 A | | 8/1983 | Onodera et al. ............. 307/415 |
| 4,473,778 A | | 9/1984 | Adachi ........................ 315/101 |
| 4,523,795 A | * | 6/1985 | Johnson et al. .............. 315/107 |
| 4,549,091 A | * | 10/1985 | Fahlen et al. ................ 307/106 |
| 4,803,378 A | * | 2/1989 | Richardson ................. 307/106 |
| 4,808,888 A | * | 2/1989 | Wyner et al. ................ 315/240 |
| 4,950,961 A | * | 8/1990 | Zaslavsky et al. .......... 315/240 |
| 5,184,085 A | * | 2/1993 | Nakajima et al. ........... 307/401 |
| 5,347,209 A | * | 9/1994 | Payne et al. ................. 323/271 |
| 5,514,918 A | | 5/1996 | Inatomi et al. .............. 307/106 |
| 5,986,413 A | * | 11/1999 | Zijlman ...................... 315/289 |

FOREIGN PATENT DOCUMENTS

| | | | | |
|---|---|---|---|---|
| EP | 0 343 890 A2 | 5/1989 | ..................... 61/54 |
| EP | 0 450 523 A1 | 3/1991 | ..................... 41/19 |
| JP | 10-76182 | 3/1998 | ..................... 3/68 |

OTHER PUBLICATIONS

R.N. Schouten, High–Voltage Power Pulse Circuit, Dec. 1, 1997, Electronic Design, p. 147.*
"Pulse Power Source Device for Electronic Dust Collector," Tomaki Teruo, Mar. 24, 1998, 2 pages.

* cited by examiner

*Primary Examiner*—Brian Sircus
*Assistant Examiner*—Sharon A. Polk
(74) *Attorney, Agent, or Firm*—Howrey Simon Arnold & White

(57) ABSTRACT

The present invention is a device using a non-linear capacitor and voltage amplification effect, which can generate a pulse having a short pulse width at high voltage. The device comprises a rectification circuit for rectifying the AC input power supply, a semiconductor switch connected to one output terminal of said rectification circuit, a primary coil connected between an output of said semiconductor switch and the other output terminal of said rectification circuit, a diode in which the cathode thereof is connected to the output of said semiconductor switch, a capacitor connected between an anode of said diode and the other output terminal of said rectification circuit, a secondary coil in which one terminal thereof is connected to the anode of said diode, a non-linear capacitor connected between the other terminal of said secondary coil and the other output terminal of said rectification circuit, and a load connected in parallel across two terminals of said non-linear capacitor.

9 Claims, 4 Drawing Sheets

HIGH VOLTAGE PULSE GENERATOR USING A NON-LINEAR CAPACITOR

This application is a national stage filing of international application PCT/KR99/00465, filed Aug. 19, 1999 which claims priority to Korean Application Number 1998/33637 filed Aug. 19, 1998. Priority is claimed to both of these prior applications.

FIELD OF THE INVENTION

The present invention relates to a high voltage pulse generator using a non-linear capacitor or, more particularly, to a device using a voltage amplification effect of a non-linear capacitor, which can generate a pulse of a short pulse width at high voltage.

BACKGROUND ART

In many application fields of pulse power, a short high-voltage pulse having a high repetition rate is needed. A discharge-type switch is usually used in producing a short high-voltage pulse. A high-voltage pulse generating circuit using a conventional discharge-type switch is shown in FIG. 8. However, the conventional discharge-type switch has a short life span and low reliability as well as a low repetition rate. In addition, the circuit has a shortcoming of being a large size because it uses a pulse transformer and a self-saturating switch.

In contrast, a semiconductor switching component has a long life span with high reliability. However, its operational voltage range and switching time are not suitable for directly driving a pulsed power system, which requires voltage amplification (transformation) and pulse compression methods. Unfortunately, a pulse transformer and a magnetic pulse compressor have a low energy efficiency and a large size.

SUMMARY OF THE INVENTION

The present invention is, therefore, directed to providing a high-voltage pulse generating device having high efficiency with small size, using a semiconductor switching component.

The present invention also seeks to provide a high voltage pulse generating device using a semiconductor switching device with a long life span, but which does not use a pulse transformer or a magnetic pulse compressor as required by conventional circuits of the prior art.

The present invention uses the voltage amplification effect of a non-linear capacitor, which was observed during the research of $BaTiO_3$ ceramic capacitors by the inventors. A ceramic capacitor has a characteristic that its capacitance is generally decreased at a voltage higher than the rated value. Because reduction in capacitance is analogous to opening a switch, a non-linear capacitor may be used for pulse generation in an inductive storage system. The present invention utilizes this non-linear characteristic of a capacitor.

A high-voltage pulse generating device according to the present invention comprises a semiconductor switch connected to one output terminal of a DC power supply or rectification circuit, a primary inductor connected between an output of said semiconductor switch and the other output terminal of said rectification circuit, a diode in which the cathode thereof is connected to the output of said semiconductor switch, a capacitor connected between an anode of said diode and the other output terminal of said rectification circuit, a secondary inductor in which one terminal thereof is connected to the anode of said diode, a non-linear capacitor connected between the other terminal of said secondary inductor and the other output terminal of said rectification circuit, and a load connected in parallel across two terminals of said non-linear capacitor.

Now, an embodiment of the present invention is described as below with reference to the accompanying drawings.

DETAILED DESCRIPTION OF THE EXEMPLARY EMBODIMENTS

Figure 1:
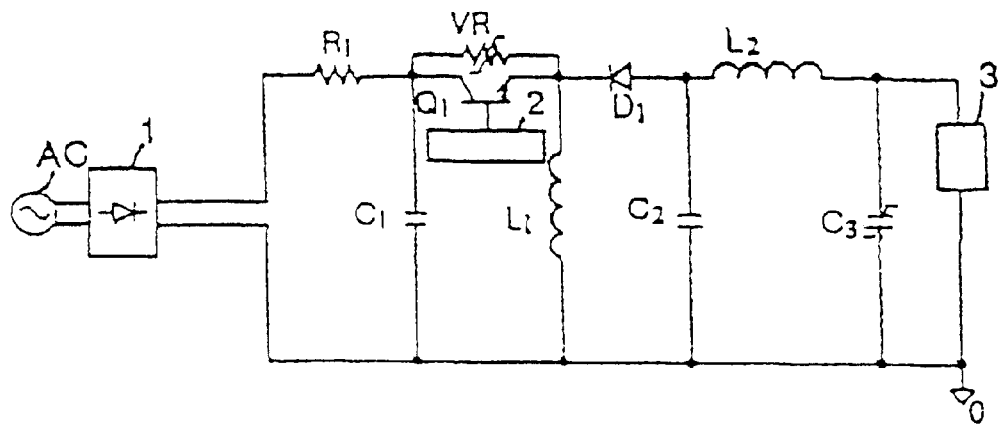
FIG. 1 is a circuit diagram describing an embodiment of the present invention.

FIG. 1 is a circuit diagram of an embodiment of a pulse generator in accordance with the present invention. In this embodiment, a resistor $R_1$ controls the charging current and a capacitor $C_1$ stores the primary energy ($\frac{1}{2}C_1V_1^2$), where the voltage across $C_1$ is $V_1$. An inductor $L_1$ stores the secondary energy ($\frac{1}{2}L_1I_1^2$) where the current flowing in $L_1$ is $I_1$. A capacitor $C_2$ stores the tertiary energy ($\frac{1}{2}C_2V_2^2$), where the voltage across $C_2$ is $V_2$. An inductor $L_2$ causes charging in the capacitor $C_2$ and the capacitor $C_3$ in addition to facilitating the saturation of $C_3$. First, AC voltage from an AC power source is converted to DC voltage through a rectification circuit comprising rectification diode (1), resistor ($R_1$) and capacitor ($C_1$). In this embodiment, a voltage of about 60V is applied to capacitor ($C_1$). The DC voltage is converted to a pulse by control of semiconductor switch ($Q_1$), which is controlled by drive circuit (2).

When semiconductor switch ($Q_1$) is "on", current flow through diode $D_1$ is prevented. Therefore, current flows only into inductor ($L_1$), and inductor ($L_1$) takes energy from low voltage capacitor ($C_1$) through semiconductor switch ($Q_1$). The current rise time in inductor $L_1$ is about 55 ms. The current magnitude stored in inductor ($L_1$) is about 130 A. Semiconductor switch ($Q_1$) is used as a first open switch having a rated voltage of about 1,200V. The switch is protected by a non-linear varistor (VR) across the switching terminals.

When semiconductor switch ($Q_1$) is opened, diode ($D_1$) becomes conductive so that the current stored in inductor ($L_1$) begins to charge capacitor ($C_2$), and a second inductor ($L_2$) becomes energized through capacitor $C_3$. When capacitor $C_3$ becomes saturated, the current from $L_1$, $L_2$ and $C_2$ begins to flow through the load resistor $R_2$ (3) and subsequently forms a high-voltage pulse therein.

When semiconductor switch ($Q_1$) is turned on, the energy ($E=\frac{1}{2}L_1I_1^2$) is stored in inductor $L_1$. When semiconductor switch ($Q_1$) is turned off, energy ($E=\frac{1}{2}C_3V^2$) is transferred and stored in capacitor $C_3$. Here, when the voltage at $C_3$ reaches a specific value, capacitor $C_3$ is saturated and its capacitance $C_3$ is reduced to $C_3'$ so that the voltage across capacitor $C_3$ is increased from $V=\sqrt{2E/C_3}$ to $V'=\sqrt{2E/C_3'}$. Because the saturation of capacitor $C_3$ proceeds in a very short period of time, a compression effect on the pulse results, which in turn applies a short pulse voltage to a load connected in parallel with capacitor $C_3$.

Figure 2:
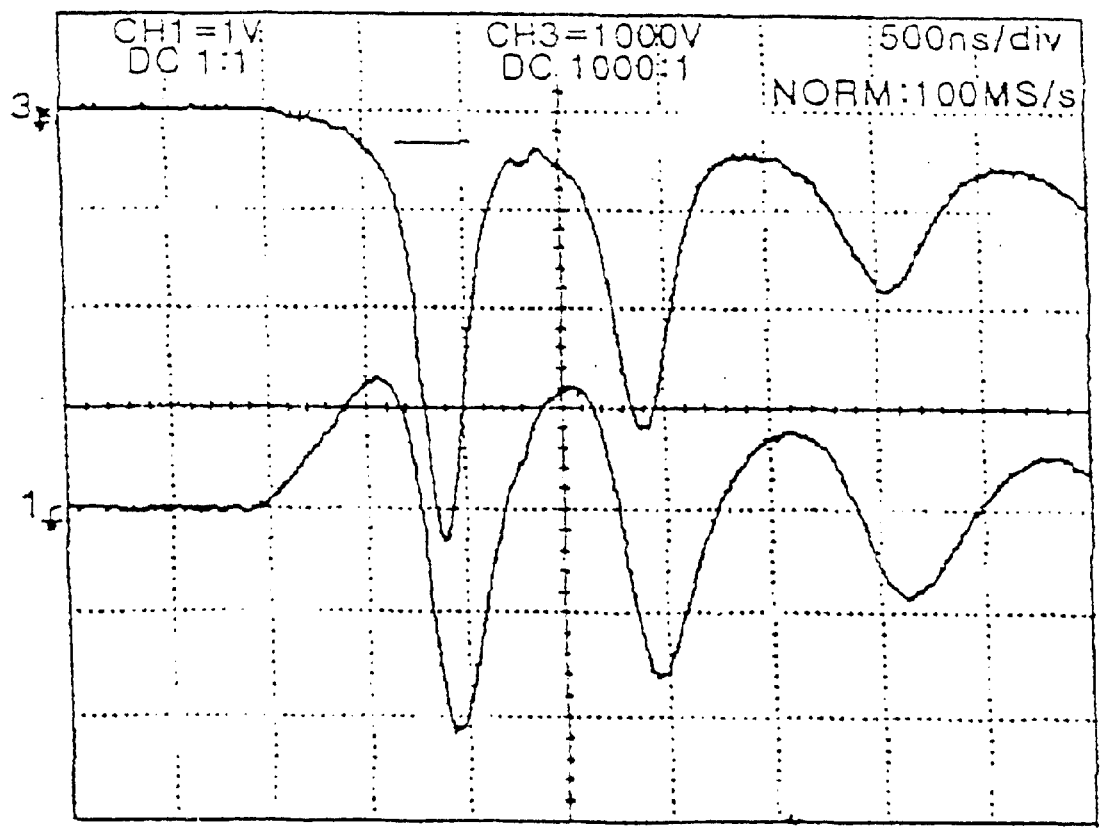
FIG. 2 is a diagram describing the waveforms of an output voltage and the current in an inductor $L_2$ in an unloaded state.

Waveforms of the output voltage and the current through inductor $L_2$ in an unloaded state are shown in FIG. 2. In FIG. 2, an upper waveform (CH3) is a waveform of the output voltage, and a lower waveform (CH1) is a waveform of the current in inductor $L_2$. In the Figure, it could be recognized that the energy is transferred back and forth as between the capacitor and the inductor from the point when semiconductor switch ($Q_1$) is turned off. In an unloaded state, there is little energy consumption so that the waveform of an oscillation state is shown when the semiconductor switch ($Q_1$) is turned off.

Figure 3:
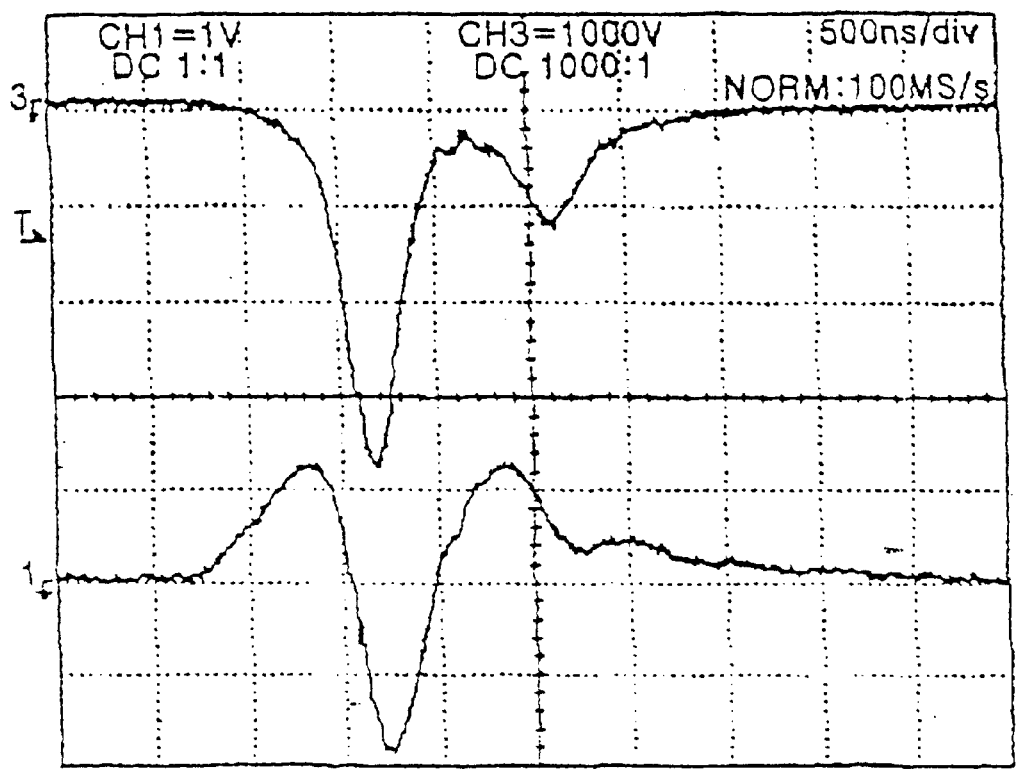
FIG. 3 is a diagram describing the waveforms of an output voltage and the current in an inductor $L_2$ when a high-voltage discharge lamp having a non-linear characteristic is used as a load.

Waveforms of an output voltage and the current in $L_2$, with a high-voltage discharge lamp as a load, are shown in FIG. 3. When a load is provided, a pulse form is obtained, which is different from the oscillation-type waveform of the unloaded circuit.

Figure 4:
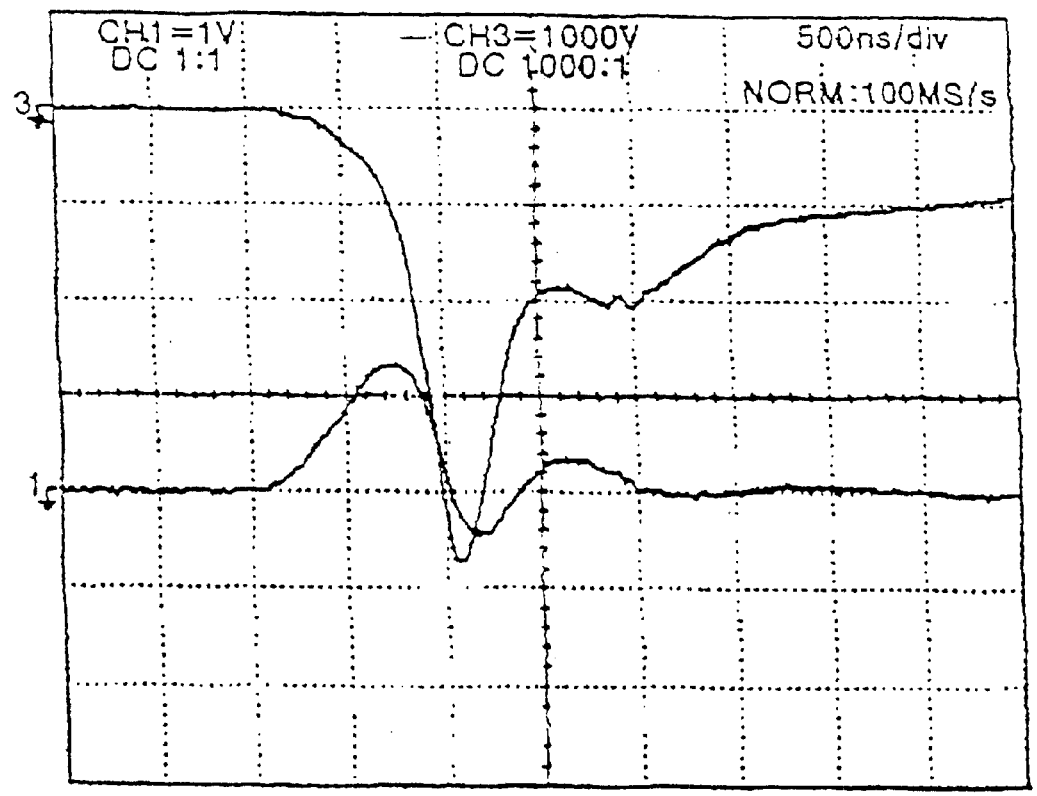
FIG. 4 is a diagram showing the waveforms of the voltage across the load and the current in $L_2$ when a pure resistor is used as a load.

Waveforms of the voltage across the load and the current in inductor $L_2$ when a 50Ω resistor is used as a load are shown in FIG. 4.

Figure 5:
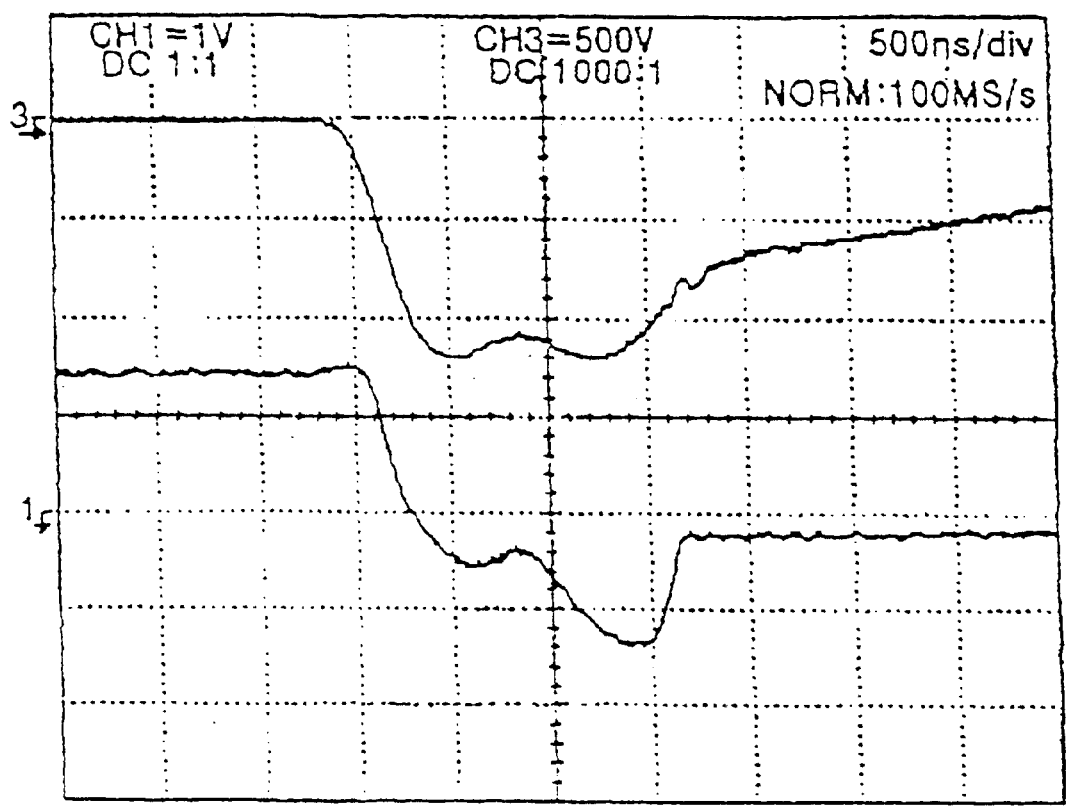
FIG. 5 is a diagram showing the waveforms of voltage across $C_2$ and the current stored in an inductor $L_1$.

FIG. 5 shows voltage at $C_2$ and the current stored in inductor $L_1$. It can be recognized in the Figure that the voltage of $C_2$ does not exceed 1,200V after the semiconductor switch ($Q_1$) is turned off. The repetition rate goes up to 50 Hz, which is limited only by the charging source.

Figure 6:
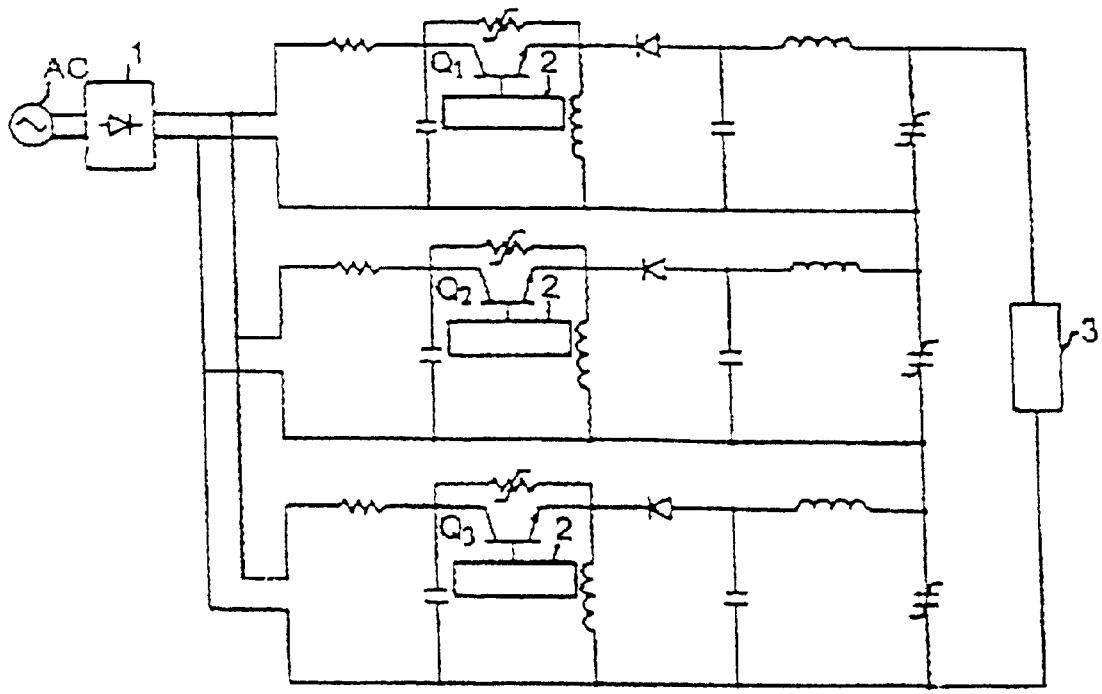
FIG. 6 is a circuit diagram showing a stacked pulse generator where three pulse generating circuits in FIG. 1 are connected together.

FIG. 6 shows a circuit diagram of a stacked pulse generator using several semiconductor switches ($Q_1$) connected together. The stacked pulse generator is used to accomplish a higher amplitude in output voltage than could be obtained using only one semiconductor switch ($Q_1$). Three identical pulse generators operating under a common load (i.e., with their outputs connected in series) are connected in parallel. The respective three semiconductor switches ($Q_1$, $Q_2$ and $Q_3$) are driven simultaneously by a common controller (2).

Figure 7:
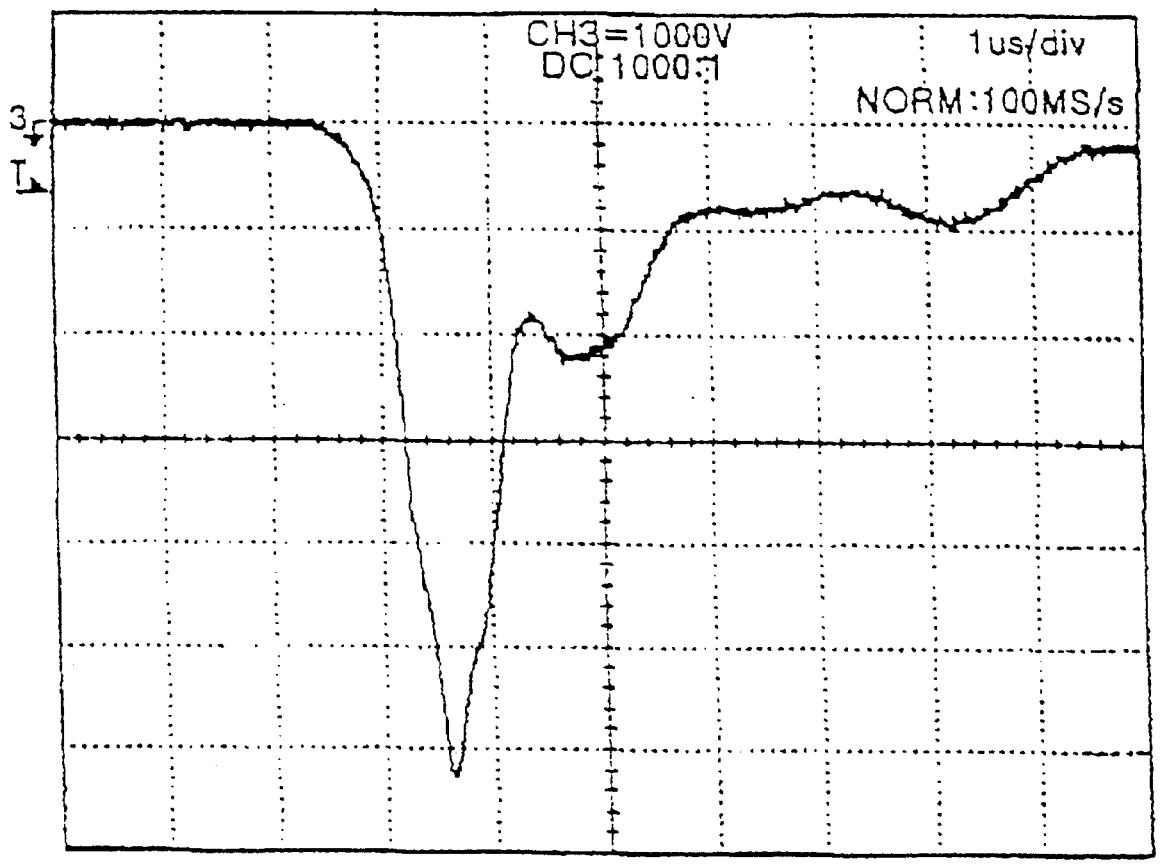
FIG. 7 is a waveform diagram describing an output from a circuit in FIG. 6.
Figure 8:
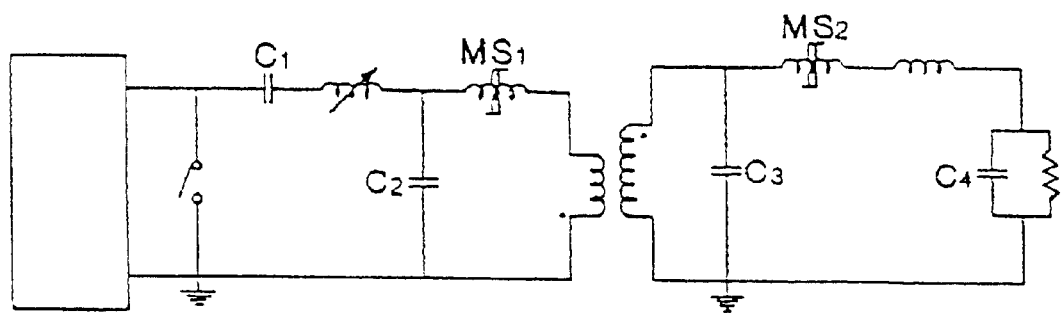
FIG. 8 is a circuit diagram describing a high-voltage pulse generating circuit using a conventional discharge switch.

An output voltage waveform for the circuit described above is shown in FIG. 7. As shown in the Figure, the total output voltage is less than three times the output of the respective pulse generator. The maximum unloaded output voltage was 6.3 kV, and the pulse width was 0.9 is (at half amplitude). This results from differences in the parameters of components in the respective pulse generators.

Although various embodiments according to the present invention have been described above, the present invention is not limited to those embodiments. For example, the specific values for the components used may be appropriately adjusted to obtain a desired pulse width or output voltage. In addition, for the non-linear capacitor, any capacitor wherein capacitance is significantly decreased at or above a certain voltage may be used.

By using a non-linear characteristic of a capacitor, it is possible to provide a high-voltage pulse generating device using a semiconductor switching device, which has a small size with high efficiency. In addition, the present invention provides a high-voltage pulse generating device using a semiconductor switching component, which does not use a pulse transformer or a magnetic pulse compressor.

What is claim is:

1. A high voltage pulse generating device comprising:
   a semiconductor switch having an input terminal connected to a first output terminal of a DC power supply;
   a primary inductor connected between an output terminal of said semiconductor switch and a second output terminal of said DC power supply;
   a diode having a cathode connected to the output terminal of said semiconductor switch;
   a capacitor connected between an anode of said diode and the second output terminal of said DC power supply;
   a secondary inductor having a first terminal connected to the anode of said diode;
   a non-linear capacitor connected between a second terminal of said secondary inductor and the second output terminal of said DC power supply.

2. A high voltage pulse generating device according to claim 1, wherein said non-linear capacitor is a ceramic capacitor.

3. A high voltage pulse generating device according to claim 1, wherein said non-linear capacitor is a $BaTiO_3$ ceramic capacitor.

4. A high voltage pulse generating device comprising:
   a plurality of pulse generating parts connected in parallel to a DC power supply, said pulse generating parts comprising:
   a semiconductor switch having a first terminal connected to a first output terminal of the DC power supply;
   a primary inductor connected between an output terminal of said semiconductor switch and a second output terminal of said DC power supply;
   a diode having a cathode connected to the output terminal of said semiconductor switch;
   a capacitor connected between an anode of said diode and the second output terminal of said DC power supply;
   a secondary inductor having a first terminal connected to the anode of said diode; and
   a non-linear capacitor connected between a second terminal of said secondary inductor and the second output terminal of said DC power supply;
   wherein said non-linear capacitors of said plurality of pulse generating parts are serially connected.

5. A high voltage pulse generating device according to claim 4, wherein said non-linear capacitor is a ceramic capacitor.

6. A high voltage pulse generating device according to claim 4, wherein said non-linear capacitor is a $BaTiO_3$ ceramic capacitor.

7. A method of generating a high voltage pulse across a load comprising:
   drawing current through an inductor; and
   opening a semiconductor switch to redirect said current through a second inductor and a non-linear capacitor in parallel with said load;
   wherein saturation of said capacitor causes a current to flow through said load, thereby generating a high voltage pulse thereacross.

8. The method of claim 7 wherein said non-liner capacitor is a ceramic capacitor.

9. The method of claim 7 wherein said non-liner capacitor is a $BaTiO_3$ ceramic capacitor.

* * * * *

UNITED STATES PATENT AND TRADEMARK OFFICE
CERTIFICATE OF CORRECTION

PATENT NO. : 6,633,093 B1
DATED : October 14, 2003
INVENTOR(S) : Guen Hie Rim et al.

It is certified that error appears in the above-identified patent and that said Letters Patent is hereby corrected as shown below:

<u>Column 8,</u>
Lines 62 and 63, replace "non-liner" with -- non-linear --.

Signed and Sealed this

Sixteenth Day of December, 2003

JAMES E. ROGAN
*Director of the United States Patent and Trademark Office*